(12) United States Patent
Motoda

(10) Patent No.: US 8,369,372 B1
(45) Date of Patent: Feb. 5, 2013

(54) LASER DEVICE

(75) Inventor: Takashi Motoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/425,523

(22) Filed: Mar. 21, 2012

(30) Foreign Application Priority Data

Jul. 29, 2011 (JP) ................. 2011-166267

(51) Int. Cl.
*H01S 5/00* (2006.01)
*H01S 3/08* (2006.01)
(52) U.S. Cl. .............. 372/50.124; 372/43.01; 372/102
(58) Field of Classification Search ........... 372/50.11, 372/50.124, 102, 43.01
See application file for complete search history.

(56) References Cited

U.S. PATENT DOCUMENTS

| 4,952,019 A * | 8/1990 | Evans et al. .............. 385/14 |
|---|---|---|
| 2004/0165637 A1 * | 8/2004 | Bullington et al. .......... 372/50 |
| 2005/0238079 A1 * | 10/2005 | Botez ..................... 372/96 |
| 2006/0056479 A1 * | 3/2006 | Evans et al. .............. 372/64 |
| 2006/0245463 A1 * | 11/2006 | Hashimoto ............... 372/96 |

FOREIGN PATENT DOCUMENTS

| JP | 63-177494 A | 7/1988 |
|---|---|---|
| JP | 2-162786 A | 6/1990 |
| JP | 3-257888 A | 11/1991 |
| JP | 2006-278729 A | 10/2006 |

* cited by examiner

*Primary Examiner* — Jessica Stultz
*Assistant Examiner* — Phillip Nguyen
(74) *Attorney, Agent, or Firm* — Leydig, Voit & Mayer

(57) ABSTRACT

A laser device includes a substrate, a lower cladding layer on the substrate, an active layer on the lower cladding layer, an upper cladding layer on the active layer, and a second order diffraction grating in a layer above the active layer and having dimensions of at least 100 μm by 100 μm. The second order diffraction grating diffracts and directs light generated in the active layer in a direction generally perpendicular to the longitudinal direction of the upper cladding layer. A laser device further includes a first reflective film on a first end face of a resonator, and a second reflective film on a second end face of the resonator, the second end face being located at the opposite end of the resonator to the first end face.

8 Claims, 8 Drawing Sheets

LASER DEVICE

BACKGROUND OF THE INVENTION

1. Field of the Invention

The present invention relates to a laser device for use in, e.g., industrial equipment, etc.

2. Background Art

Japanese Laid-Open Patent Publication No. H02-162786 discloses a laser device having a second order diffraction grating. This second order diffraction grating is configured so that the laser device emits laser light in a direction perpendicular to the main surface of the substrate.

The second order diffraction grating of the laser device disclosed in the above publication is small, since the ridge width of the laser device is 4 μm and the length of the light emission region is 10 μm or less. Laser devices having such a small second order diffraction grating are not suitable for use in high output power applications, since it is not possible to reduce the optical density.

SUMMARY OF THE INVENTION

The present invention has been made to solve the foregoing problem. It is, therefore, an object of the present invention to provide a laser device suitable for use in high output power applications.

The features and advantages of the present invention may be summarized as follows.

According to one aspect of the present invention, a laser device includes a substrate, a lower cladding layer formed on the substrate, an active layer formed on the lower cladding layer, an upper cladding layer formed on the active layer, a second order diffraction grating formed in a layer above the active layer and having dimensions of at least 100 μm by 100 μm, the second order diffraction grating diffracting and directing light generated by the active layer upward out of the upper cladding layer, a first reflective film formed on a first end face of a resonator and reflecting light generated by the active layer, the resonator including the lower cladding layer, the active layer, and the upper cladding layer, and a second reflective film formed on a second end face of the resonator and reflecting light generated by the active layer, the second end face being located at the opposite end of the resonator to the first end face.

Other and further objects, features and advantages of the invention will appear more fully from the following description.

DETAILED DESCRIPTION OF THE PREFERRED EMBODIMENTS

First Embodiment

Figure 1:
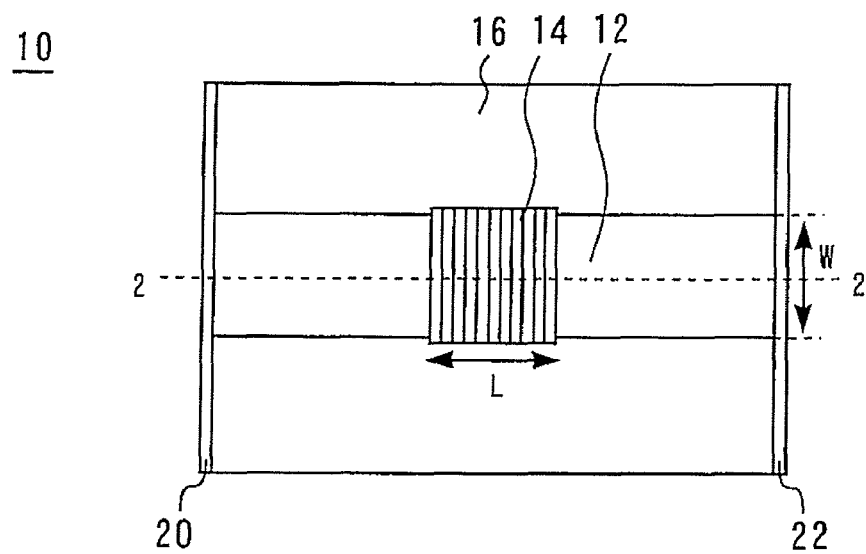
FIG. 1 is a plan view of a laser device in accordance with a first embodiment of the present invention.

FIG. 1 is a plan view of a laser device 10 in accordance with a first embodiment of the present invention. The laser device 10 of the first embodiment has formed therein a ridge stripe 12 for generating laser light in multiple transverse modes. A second order diffraction grating 14 is formed at the middle portion of the ridge stripe 12. The second order diffraction grating 14 has a dimension of 100 μm in the longitudinal direction of the resonator (i.e., the direction indicated by the letter L in FIG. 1), and a dimension of 100 μm in the transverse direction of the resonator (i.e. the direction indicated by the letter W in FIG. 1). That is, the second order diffraction grating 14, which defines the light emission region, is 100 μm by 100 μm in size (relatively large). The entire surface of the ridge stripe 12 is covered by an electrode 16, except for the second order diffraction grating 14. The laser device 10 has a first reflective film 20 and a second reflective film 22 formed thereon which serve as end face coatings.

Figure 2:
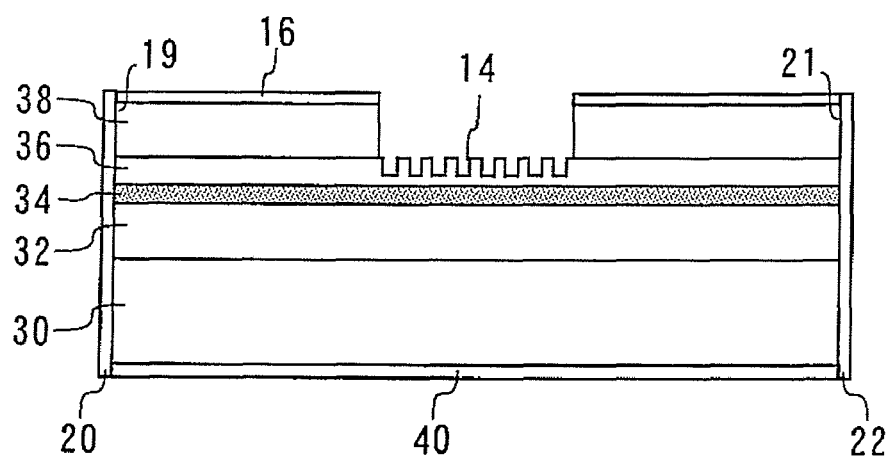
FIG. 2 is a cross-sectional view taken along dashed line 2-2 of FIG. 1.

FIG. 2 is a cross-sectional view taken along dashed line 2-2 of FIG. 1. The laser device 10 includes a substrate 30. A lower cladding layer 32 is formed on the substrate 30. An active layer 34 is formed on the lower cladding layer 32. An upper cladding layer 36 is formed on the active layer 34. The lower cladding layer 32, the active layer 34, and the upper cladding layer 36 together form the resonator. The resonator is formed of AlGaAs-based materials (AlGaAs, GaAs), AlGaInP-based materials (AlGaInP, GaInP, GaAs, AlGaAs), or GaN-based materials (GaN, InGaN, InAlGaN, etc.). The second order diffraction grating 14 is formed in the upper cladding layer 36 and has such a period that light generated by the active layer 34 is diffracted and directed by the diffraction grating 14 upward out of the upper cladding layer 36.

As shown in FIG. 2, one end of the resonator has a first end face, or facet, 19 formed by cleavage, etc., and the other end has a second end face 21 formed by cleavage, etc. The first reflective film 20, which reflects light generated by the active layer 34, is formed on the first end face 19. The second reflective film 22, which also reflects light generated by the active layer 34, is formed on the second end face 21. The first and second reflective films 20 and 22 totally reflect the incident light from the active layer 34.

A contact layer 38 is formed on the upper cladding layer 36. The electrode 16 is formed on the contact layer 38. Further, an electrode 40 is formed on the bottom surface of the substrate 30.

Figure 3:
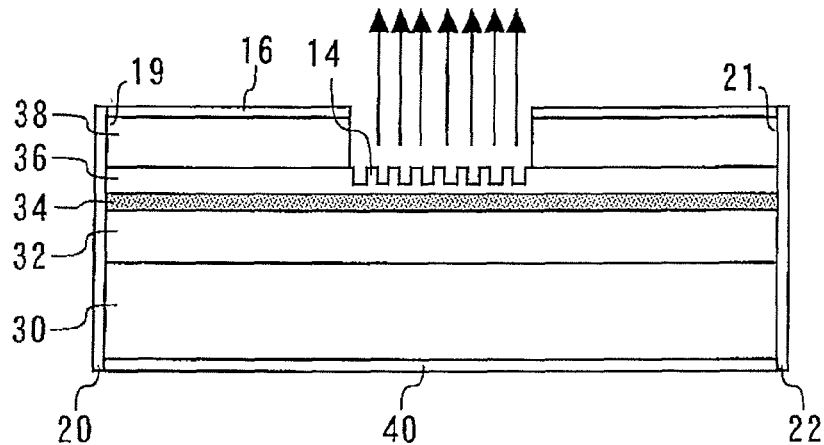
FIG. 3 is a cross-sectional view showing the direction in which the laser device of the first embodiment emits light.

FIG. 3 is a cross-sectional view showing the direction in which the laser device 10 of the first embodiment emits light. Due to the action of the second order diffraction grating 14, the laser device 10 emits laser light in a direction perpendicular to a crystal plane of the resonator. The laser light emitting direction is indicated by arrows in FIG. 3.

In order to reduce the threshold current of a laser device and thereby increase the current efficiency, it is general practice to reduce the width of the ridge stripe of the laser device. However, since a reduction in the width of the ridge stripe results in an increase in the optical density in the resonator, COD might occur to the laser device. This means that it is not possible to increase the output power of a conventional laser device while reducing the threshold current. Especially in the case of laser devices which emit light from an end face (or facet) thereof, the active layer in which light is confined has a thickness of only approximately 0.1 µm, resulting in increased optical density therein.

In the laser device of the first embodiment, on the other hand, the second order diffraction grating 14 is formed to have dimensions of 100 µm by 100 µm, meaning that light is emitted from a large light emission region of the laser device. Therefore, the optical density in the laser device can be reduced, e.g., to approximately 1/100 of that in laser devices of the end face emission type. That is, by reducing the optical density it is possible to prevent degradation of the laser device due to COD thus making it possible to increase the output power of the laser device.

Figure 4:
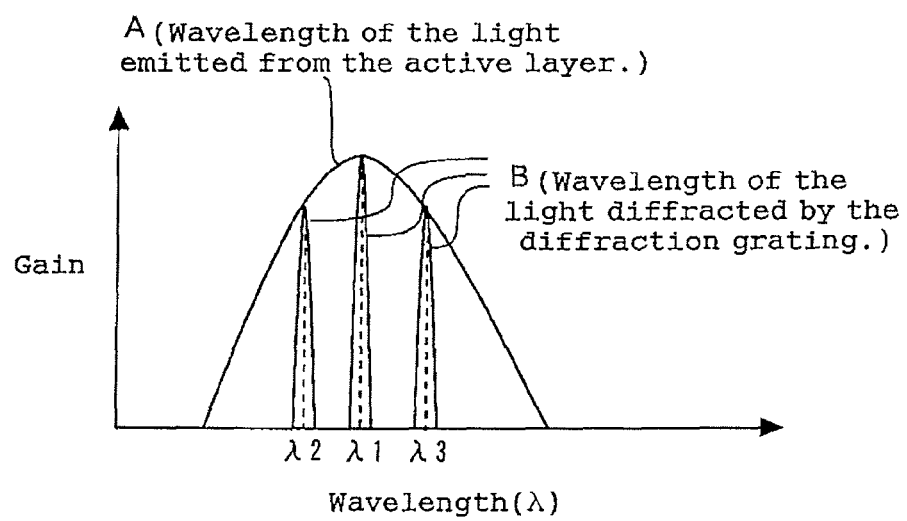
FIG. 4 is a diagram showing the wavelengths of light diffracted by the second order diffraction grating.

FIG. 4 is a diagram showing the wavelengths of light diffracted by the second order diffraction grating 14. The active layer 34 emits light having a range of wavelengths about the central wavelength λ1, as represented by curve A in FIG. 4. In this example, the second order diffraction grating 14 is formed to have such a period as to diffract the central wavelength λ1 of light so that the diffraction grating 14 has a relatively high grain. However, the second order diffraction grating 14 may have such a period as to diffract a wavelength of light other than the central wavelength λ1. For example, the period of the second order diffraction grating 14 may be such that the diffraction grating 14 diffracts a wavelength λ2 of light shorter than the central wavelength λ1, or a wavelength λ3 of light longer than the central wavelength λ1. The wavelength λ3 of light corresponds to a lower bandgap energy than the central wavelength λ1 of light. Therefore, the second order diffraction grating 14 may have such a period as to diffract a wavelength of light longer than the central wavelength λ1, e.g., diffract pure blue light (corresponding to λ3), in order to reduce the optical loss in the active layer 34. In this way it is possible to reduce the loss in the laser device.

In the laser device 10 of the first embodiment, the first reflective film 20 and the second reflective film 22 prevent emission of light from the end faces of the resonator, thus preventing leakage of light from these end faces.

Figure 5:
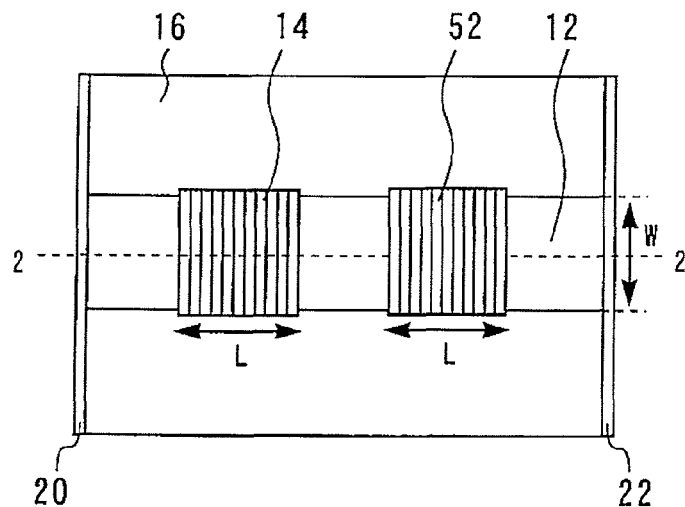
FIG. 5 is a plan view of a variation of the laser device of the first embodiment.

FIG. 5 is a plan view of a variation of the laser device 10 of the first embodiment. The following description of this laser device 29 will be primarily directed to the differences from the laser device 10. In this laser device 29, two second order diffraction gratings 14 and 52 are formed in such a manner that light generated by the active layer is diffracted and directed upward out of the upper cladding layer. The second order diffraction grating 52 is formed in a layer above the active layer and has a different period than the second order diffraction grating 14. The second order diffraction grating 52 is hereinafter referred to as the second diffraction grating 52. The second diffraction grating 52 is formed to have dimensions of 100 µm by 100 µm.

Figure 6:
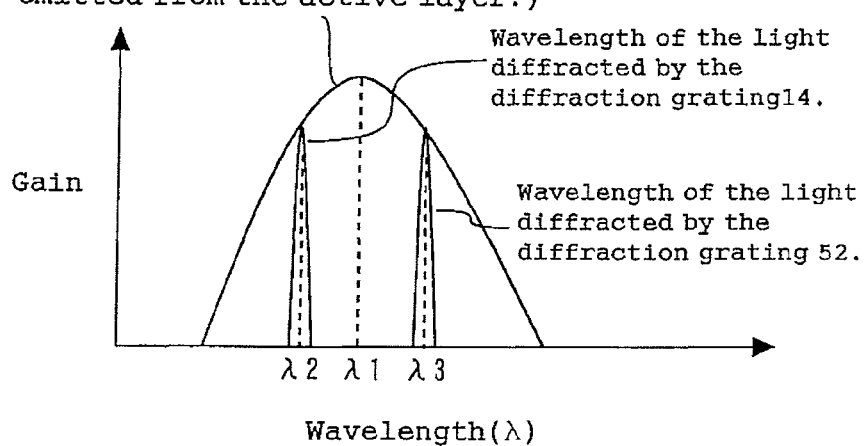
FIG. 6 is a diagram showing the wavelengths of light diffracted by the second order diffraction grating and the second diffraction grating.

FIG. 6 is a diagram showing the wavelengths of light diffracted by the second order diffraction grating 14 and the second diffraction grating 52. The second order diffraction grating 14 diffracts a wavelength λ2 of light, and the second diffraction grating 52 diffracts a different wavelength λ3 of light. Thus, two diffraction gratings having different periods are formed at different locations on the ridge stripe 12, making it possible to emit two wavelengths of light.

Although in the laser device 10 of the first embodiment the second order diffraction grating 14 has dimensions of 100 µm by 100 µm, it is to be understood that the diffraction grating 14 is not limited to these dimensions. The optical density in the laser device can be substantially reduced if the second order diffraction grating 14 has dimensions of 100 µm by 100 µm or more.

Although the resonator of the laser device 10 of the first embodiment is formed of GaN-based materials, it is to be understood that the present invention is not limited to these particular materials. Further, the diffraction grating 14 may be formed to extend along the entire length of the resonator. In order to reduce the loss in the laser device, it is desirable that the first reflective film 20 and the second reflective film 22 totally reflect the incident light from the active layer. However, the present invention only requires that these reflective films serve to reduce the optical loss at the end faces of the resonator by some amount. Further, the second order diffraction grating 14 and the second diffraction grating 52 need not necessarily be formed in the upper cladding layer 36, but may be formed in any suitable layer above the active layer 34.

Further, the second order diffraction grating 14 may have equal dimensions along the longitudinal and transverse directions of the resonator in order to achieve a uniform FFP. If, however, the FFP of the laser device is not important, the diffraction grating 14 may have different dimensions in the longitudinal and transverse directions of the resonator.

Second Embodiment

Figure 7:
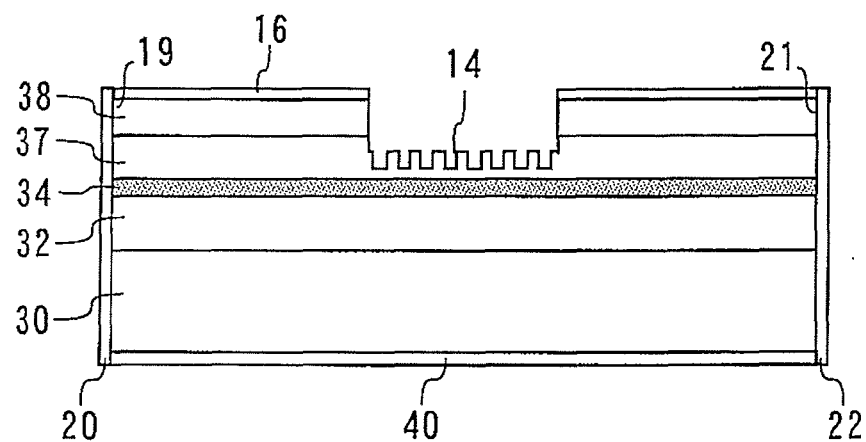
FIG. 7 is a cross-sectional view of a laser device in accordance with a second embodiment of the present invention.

FIG. 7 is a cross-sectional view of a laser device in accordance with a second embodiment of the present invention. The following description of this laser device will be directed only to the differences from the laser device 10 described above. The upper cladding layer 37 of this laser device is formed to be thicker than the upper cladding layer 36 of the laser device 10. Specifically, the thick upper cladding layer 37 has an etched portion, and the second order diffraction grating 14 is formed in the exposed bottom surface of this etched portion. The resonator is formed of, e.g., GaAs-based materials such as AlGaInP-based or AlGaAs-based materials. Further, the contact layer 38 is formed of GaAs. Thus, the upper cladding layer 37 of the laser device of the second embodiment has a substantial thickness, making it possible to reduce the optical absorption in the contact layer 38.

Third Embodiment

Figure 8:
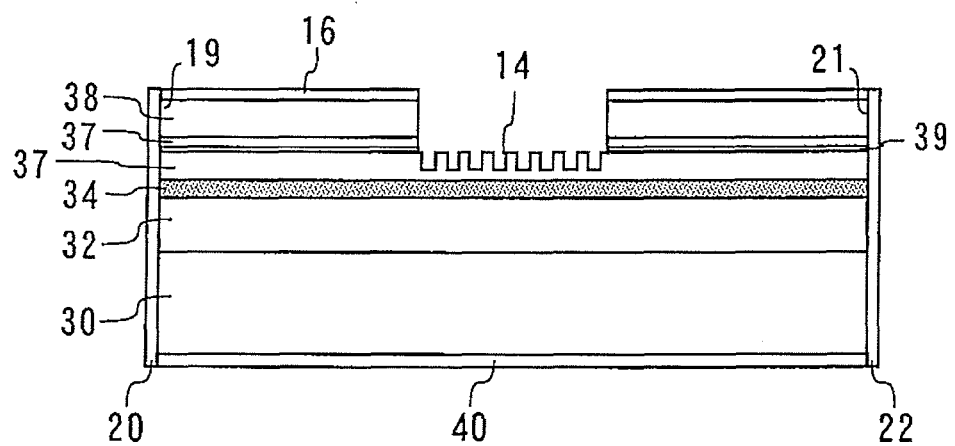
FIG. 8 is a cross-sectional view of a laser device in accordance with a third embodiment of the present invention.

FIG. 8 is a cross-sectional view of a laser device in accordance with a third embodiment of the present invention. The following description of this laser device will be directed only to the differences from the laser device 10 described above. The upper cladding layer 37 of this laser device is formed to be thicker than the upper cladding layer 36 of the laser device 10 described above. Further, this laser device includes an etch stopper layer 39 for forming the second order diffraction grating 14. The etch stopper layer 39 is sandwiched between portions of the upper cladding layer 37. The second order diffraction grating 14 is formed as follows: After the contact layer 38 has been formed, portions of the contact layer 38, the upper cladding layer 37, and the etch stopper layer 39 are etched away to expose the surface of the upper cladding layer 37 where the second order diffraction grating 14 is to be formed. The second order diffraction grating 14 is then formed in the exposed portion of the upper cladding layer 37. In this way it is possible to easily form the second order diffraction grating 14. Further, the upper cladding layer 37 can be formed to have a substantial thickness, making it possible to reduce the optical absorption in the contact layer 38, as in the second embodiment.

Fourth Embodiment

Figure 9:
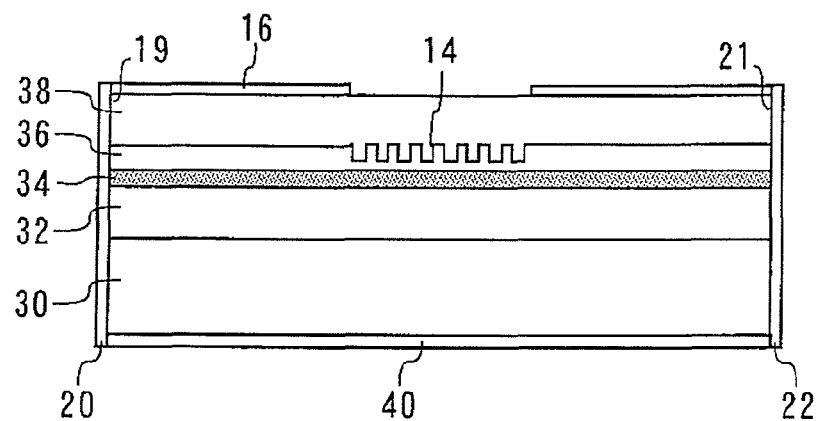
FIG. 9 is a cross-sectional view of a laser device in accordance with a fourth embodiment of the present invention.

FIG. 9 is a cross-sectional view of a laser device in accordance with a fourth embodiment of the present invention. The following description of this laser device will be directed only to the differences from the laser device 10 described above. In the laser device of the fourth embodiment, the second order diffraction grating 14 is covered by the contact layer 38. The contact layer 38 is formed of GaN. Further, the resonator is formed of GaN-based materials. Since the contact layer 38 is formed of GaN, it has no optical absorption, so that the second order diffraction grating 14 can be buried under the contact layer 38. In the manufacturing process of this laser device, the contact layer 38 is formed after the upper cladding layer 36 and the second order diffraction grating 14 have been formed. It should be noted that the material of the contact layer 38 is not limited to GaN, but may be any crystal having a bandgap greater than the lasing wavelength of the laser device.

Fifth Embodiment

Figure 10:
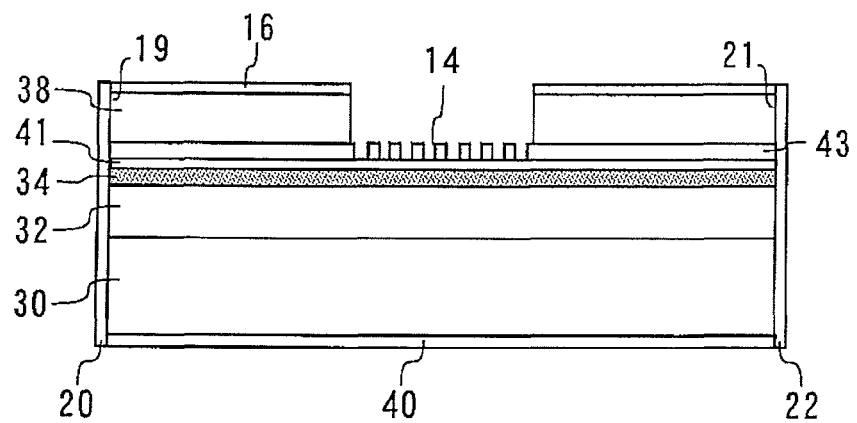
FIG. 10 is a cross-sectional view of a laser device in accordance with a fifth embodiment of the present invention.

FIG. 10 is a cross-sectional view of a laser device in accordance with a fifth embodiment of the present invention. The following description of this laser device will be directed only to the differences from the laser device 10 described above. In the laser device of the fifth embodiment, a diffraction grating layer 43 is formed on an upper cladding layer 41. The diffraction grating layer 43 is formed of InGaN. The second order diffraction grating 14 is formed in the diffraction grating layer 43. In this way, the second order diffraction grating 14 may be formed in a layer other than the upper cladding layer 41 while still retaining the advantages of the present invention.

Figure 11:
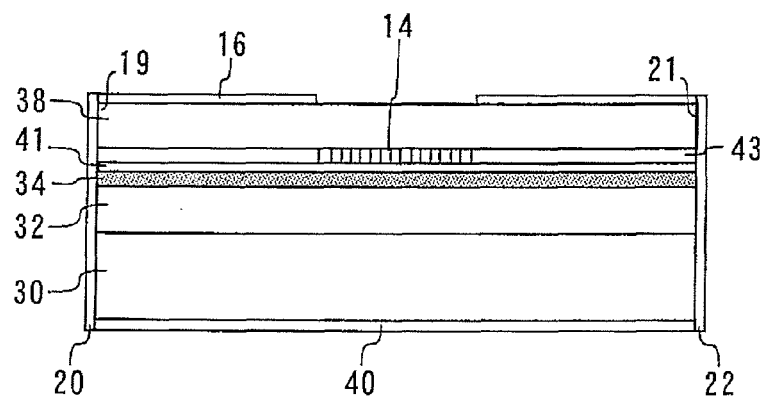
FIG. 11 is a cross-sectional view of a variation of the laser device of the fifth embodiment.

FIG. 11 is a cross-sectional view of a variation of the laser device of the fifth embodiment. In this laser device, the second order diffraction grating 14 formed in the diffraction grating layer 43 is buried under the contact layer 38. The contact layer 38 is formed of GaN. Since the contact layer 38 is formed of a different material than the second order diffraction grating 14, the second order diffraction grating 14 can be buried under the contact layer 38.

Sixth Embodiment

Figure 12:
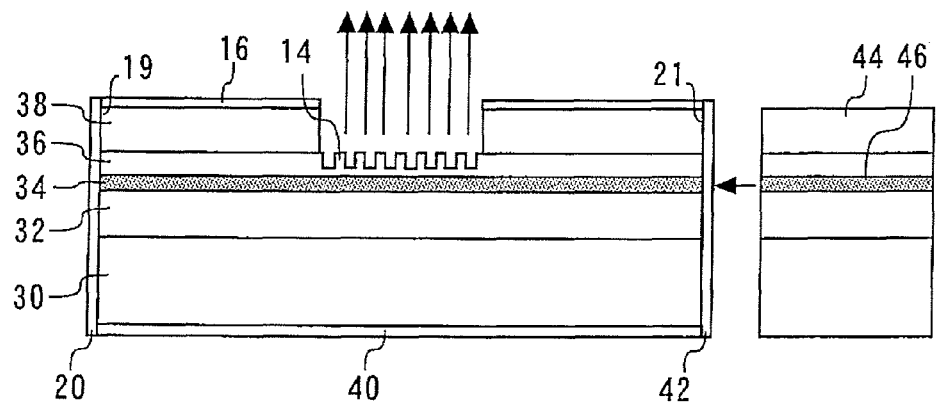
FIG. 12 is a cross-sectional view of a laser device in accordance with a sixth embodiment of the present invention.

FIG. 12 is a cross-sectional view of a laser device in accordance with a sixth embodiment of the present invention. The following description of this laser device will be directed only to the differences from the laser device 10 described above. The second end face 21 of the laser device of the sixth embodiment has formed thereon a semi-transparent mirror coating 42 which transmits the external light incident thereon while reflecting light generated by the active layer 34.

The laser device of the sixth embodiment is used with an external laser device 44. The light generated by the active layer 46 of the external laser device 44 enters the laser device of the sixth embodiment through the semi-transparent mirror coating 42 and excites light emission from the active layer 34 of the laser device. The light generated by the active layer 34 is diffracted and directed by the second order diffraction grating 14 upward out of the upper cladding layer 36. The use of the external laser device 44 allows efficient excitation of light emission. It should be noted that a plurality of laser devices may be integrated together to emit light with high power.

The laser device of the sixth embodiment is susceptible of at least alterations similar to those that can be made to the laser device of the first embodiment. Likewise, any of the features of the second to fifth embodiments may be incorporated into the laser device of the sixth embodiment.

Seventh Embodiment

Figure 13:
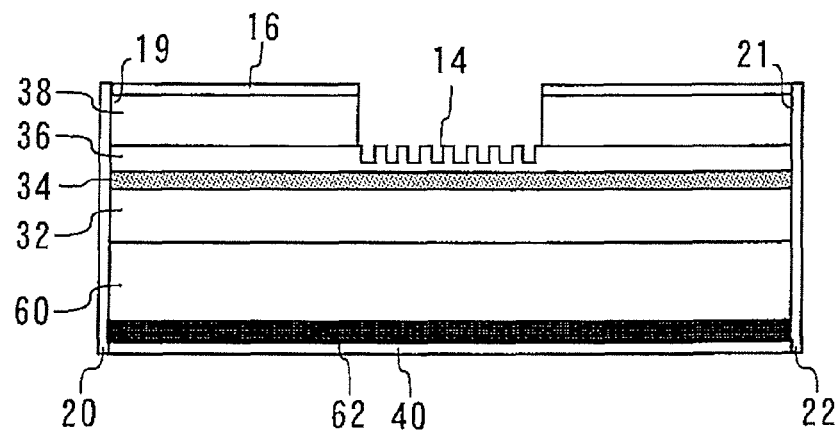
FIG. 13 is a cross-sectional view of a laser device in accordance with a seventh embodiment of the present invention.

FIG. 13 is a cross-sectional view of a laser device in accordance with a seventh embodiment of the present invention. The following description of this laser device will be directed only to the differences from the laser device 10 described above. A light-reflective layer 62 is formed on the bottom surface of the substrate 60 of this laser device. The light-reflective layer 62 is gold plating. The substrate 60 is formed of a material having a greater bandgap than the active layer 34.

Figure 14:
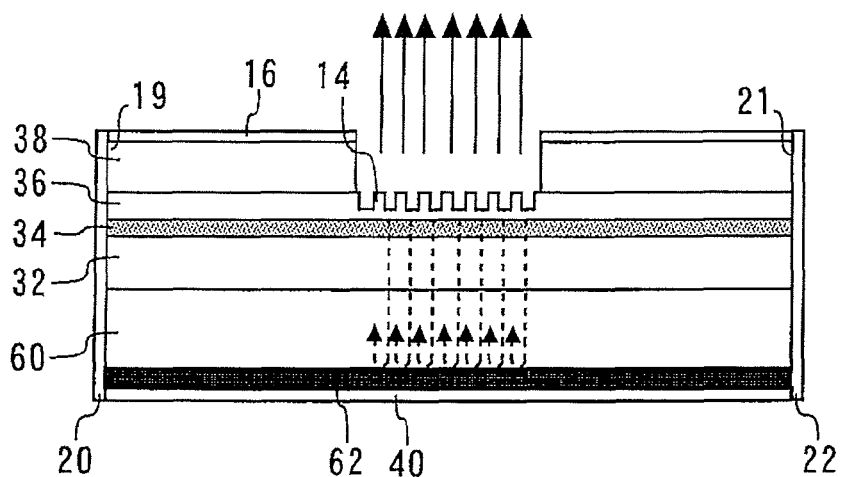
FIG. 14 is a cross-sectional view showing reflection of the downward laser light in the laser device of the seventh embodiment.

It should be noted that the diffraction grating 14 diffracts and directs light generated by the active layer 34 toward the lower surface of the resonator as well as toward the upper surface thereof. The light directed toward the upper surface of the resonator is referred to herein as the upward laser light, and the light directed toward the lower surface of the resonator is referred to herein as the downward laser light. The downward laser light is absorbed, etc. by, for example, the substrate, causing a loss of power. However, the laser device of the seventh embodiment is configured to reduce this power loss. FIG. 14 is a cross-sectional view showing reflection of the downward laser light in the laser device of the seventh embodiment. The downward laser light is indicated by dashed lines in FIG. 14. In the laser device of the seventh embodiment, the downward laser light is reflected by the light-reflective layer 62 upward to combine with the upward laser light. Therefore, this configuration makes it possible to increase the output power of the laser device. Further, since the substrate 60 has a greater bandgap than the active layer 34, the substrate 60 has reduced absorption of the downward laser light.

Figure 15:
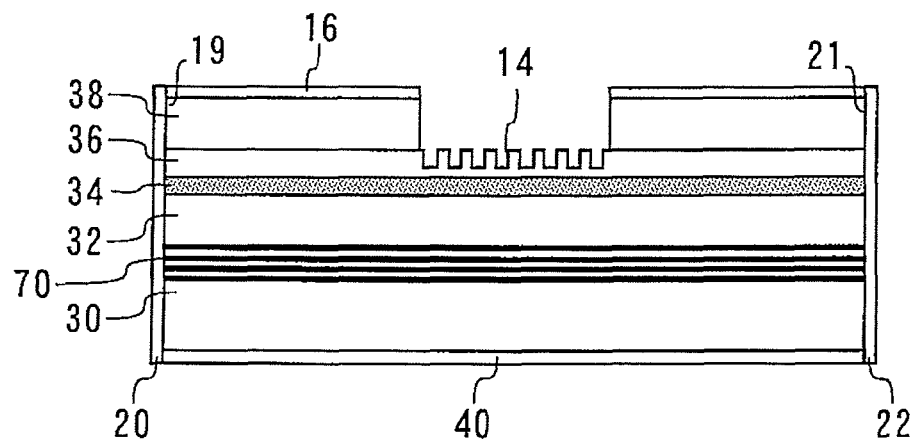
FIG. 15 is a cross-sectional view showing a light-reflective layer formed in the lower cladding layer.
Figure 16:
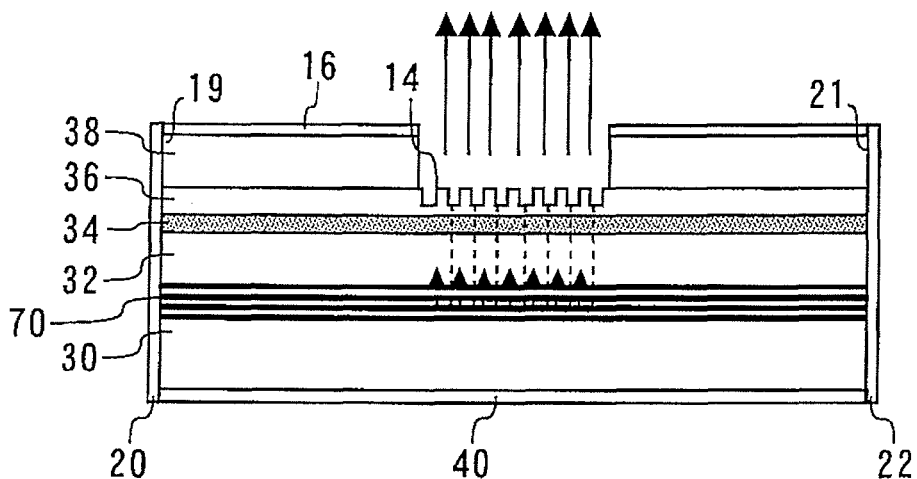
FIG. 16 is a cross-sectional view showing the reflection of light by the reflective layer.

The light-reflective layer 62 need not necessarily be gold plating, but may be a reflective film or reflective coating, etc. Further, the advantages of the present embodiment described above result from the fact that the downward laser light is reflected upward to combine with the upward laser light. Therefore, the light-reflective layer may be formed, e.g., in the lower cladding layer. FIG. 15 is a cross-sectional view showing a light-reflective layer 70 formed in the lower cladding layer. The light-reflective layer 70 is a multilayer film consisting of alternating crystal layers of different refractive indices. FIG. 16 is a cross-sectional view showing the reflection of light by the reflective layer.

The laser device of the seventh embodiment is susceptible of at least alterations similar to those that can be made to the laser device of the first embodiment. Further, any of the features of the second to fifth embodiments may be incorporated into the laser device of the seventh embodiment.

Although the foregoing description does not describe the details of the epitaxial structures of the active layer, etc. in order to facilitate the understanding of the present invention, it is to be understood that the active layer may have a SQW (single quantum well) structure or a MQW (multiquantum well) structure. Further, a band discontinuity reduction layer may be formed between the upper cladding layer and the contact layer in order to reduce the bandgap between these layers.

In accordance with the present invention, the optical density in a laser device can be reduced by forming a large second order diffraction grating therein, making it possible to provide a laser device suitable for use in high output power applications.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-166267, filed on Jul. 29, 2011, including specification, claims, drawings, and summary, on which the Convention priority of the present application is based, is incorporated herein by reference in its entirety.

What is claimed is:

1. A laser device comprising:
a substrate;
a lower cladding layer supported by said substrate;
an active layer supported by said lower cladding layer;
an upper cladding layer supported by said active layer;
first and second diffraction gratings located in a layer on the same side of said active layer, relative to said substrate, as said upper cladding layer and each having dimensions of at least 100 μm by 100 μm, said first and second diffraction gratings having different periods and diffracting and directing light generated in said active layer in the direction generally perpendicular to the longitudinal direction of said upper cladding layer, wherein said lower cladding layer, said active layer, and said upper cladding layer have opposed first and second end faces defining a resonator;
a first reflective film located on said first end face of said resonator and reflecting light generated in said active layer; and
a second reflective film located on said second end face of said resonator and reflecting light generated in said active layer.

2. The laser device according to claim 1, wherein said first and second reflective films totally reflect the light generated in said active layer.

3. The laser device according to claim 1, wherein dimensions of said first diffraction grating are equal along a longitudinal direction and a transverse direction of said resonator.

4. The laser device according to claim 1, wherein said second reflective film includes a semi-transparent mirror coating which transmits external light incident on the second reflective film and reflects the light generated in said active layer.

5. A laser device comprising:
a substrate;
a lower cladding layer supported by said substrate;
an active layer supported by said lower cladding layer;
an upper cladding layer supported by said active layer;
a first diffraction grating located in a layer on the same side of said active layer, relative to said substrate, as said upper cladding layer and having dimensions of at least 100 μm by 100 μm, said first diffraction grating diffracting and directing light generated in said active layer in a direction generally perpendicular to said upper cladding layer, wherein said lower cladding layer, said active layer, and said upper cladding layer have opposed first and second end faces defining a resonator;
a first reflective film located on said first end face of said resonator and reflecting light generated in said active layer;
a second reflective film located on said second end face of said resonator and reflecting light generated in said active layer;
a light-reflective layer located in said substrate, wherein said substrate is a material having a wider bandgap than said active layer.

6. The laser device according to claim 5, wherein said first and second reflective films totally reflect the light generated in said active layer.

7. The laser device according to claim 5, wherein dimensions of said first diffraction grating are equal along a longitudinal direction and a transverse direction of said resonator.

8. The laser device according to claim 5, wherein said second reflective film includes a semi-transparent mirror coating which transmits external light incident on the second reflective film and reflects the light generated in said active layer.

* * * * *